US008391528B2

(12) United States Patent
Vercelli et al.

(10) Patent No.: US 8,391,528 B2
(45) Date of Patent: Mar. 5, 2013

(54) LOUDSPEAKER SLOTTED DUCT PORT

(75) Inventors: Marcelo Vercelli, Woodinville, WA (US); Petr Stolz, Milevsko (CZ)

(73) Assignee: Freedman Electronics Pty Ltd, Silverwater (AU)

( * ) Notice: Subject to any disclaimer, the term of this patent is extended or adjusted under 35 U.S.C. 154(b) by 621 days.

(21) Appl. No.: 12/507,229

(22) Filed: Jul. 22, 2009

(65) Prior Publication Data

US 2010/0027828 A1 Feb. 4, 2010

Related U.S. Application Data

(60) Provisional application No. 61/082,784, filed on Jul. 22, 2008.

(51) Int. Cl.
*H04R 1/20* (2006.01)
*H05K 5/00* (2006.01)

(52) U.S. Cl. ......................... 381/349; 381/345; 181/156

(58) Field of Classification Search .................. 381/345, 381/349; 181/156
See application file for complete search history.

(56) References Cited

U.S. PATENT DOCUMENTS

| | | | | |
|---|---|---|---|---|
| 5,714,721 | A * | 2/1998 | Gawronski et al. | 181/156 |
| 6,597,795 | B1 * | 7/2003 | Swenson | 381/349 |
| 7,162,049 | B2 | 1/2007 | Polk, Jr. | |
| 2005/0087392 | A1 | 4/2005 | Flanders et al. | |
| 2007/0215407 | A1 | 9/2007 | Chiang | |

* cited by examiner

*Primary Examiner* — Yuwen Pan
*Assistant Examiner* — Matthew Eason
(74) *Attorney, Agent, or Firm* — AEON Law; Adam L. K. Philipp

(57) ABSTRACT

Provided herein is a loudspeaker system utilizing one or more ducted slot ports. In various embodiments, a ducted slot port may incorporate an acoustic low pass filter, such as a bend in the airflow path, to control midrange leakage. A ducted slot port may also minimize standing waves within the port duct and control turbulent port noise, such as by varying its cross-sectional area substantially continuously and symmetrically along the port duct's entrance-exit axis.

13 Claims, 13 Drawing Sheets

LOUDSPEAKER SLOTTED DUCT PORT

CROSS REFERENCE TO RELATED APPLICATIONS

This application claims the benefit of priority to U.S. Provisional Application No. 61/082,784, entitled "LOW-DISTORTION, LOW-PASS PORT," with inventors Marcelo Vercelli and Petr Stolz, filed Jul. 22, 2008. The above-cited application is incorporated herein by reference in its entirety, for all purposes.

FIELD

The present disclosure relates generally to ported loudspeaker systems, and more particularly, to an improved port in a loudspeaker system.

BACKGROUND

It has been known for over 50 years that greater low frequency efficiency in a loudspeaker system may be obtained by incorporating a mass-compliance resonance device. There are two basic approaches in common use in connection with mass-compliance resonance devices in loudspeaker systems: the ducted port (sometimes referred to as a "vent") and the passive radiator. Although the passive radiator has some advantages, the ducted port has generally been more popular because it is less expensive, easier to manufacture, and more compact than a passive radiator.

There are, however, disadvantages to the ducted port approach. An ideal ducted port would pass only low frequencies, reinforcing the low frequency output of an actively driven transducer, but adding no coloration or independent sonic signature above the ducted port's desired pass band. Acoustic disadvantages of ducted ports arise when a ducted port's performance deviates from this ideal, adding distortion (e.g., coloration and/or undesirable noise) to the mid- and/or high-frequency output of the loudspeaker system. These disadvantages tend to be more prominent at high air velocities within the ducted port. In addition, midrange frequencies generated by the back wave of an active driver can "leak" out of the ducted port, adding undesirable coloration to the loudspeaker's output.

It is well known to those skilled in the art that a vented loudspeaker system has a specific tuning frequency determined by the volume of air in the enclosure and the acoustic mass of air provided by the ducted port. As a rule, relatively low tuning frequencies are desirable for high performance loudspeaker systems. The tuning frequency of a vented loudspeaker system can be lowered by increasing the "acoustic mass" in the ducted port or by increasing compliance by increasing the enclosure volume.

The acoustic mass of a ducted port is directly related to the mass of air contained within the ducted port but inversely related to the cross-sectional area of the ducted port. This relationship suggests that to achieve a lower tuning frequency a longer ducted port with smaller cross-sectional area should be used. However a small cross-section is in conflict with the larger volume velocities of air required to reproduce higher sound pressure levels at lower frequencies. For example, if the diameter of a ducted port is too small or is otherwise improperly designed, non-linear behavior such as chuffing, whistling, or port-noise due to air turbulence can result in audible distortions and loss of efficiency at low frequencies particularly at higher levels of operation. In addition, viscous drag from air movement in the ducted port can result in additional loss of efficiency at lower frequencies.

One way to lower the velocity of air within a ducted port is to use a long and narrow cross-section. Ducted ports with long and narrow cross sections are often referred to as "slot ports." As used herein, the term "slot port" refers to a port having a relatively narrow cross section at its exit, in which the cross-section exit ratio of the port exit's longer dimension to its shorter dimension is at least 4:1. Slot ports tend to have naturally lower air velocity than conventional round ports. However, slot ports tend to have higher port noise caused by turbulence, as they have more wall area for a given cross-section than a corresponding round port. Accordingly, front-loaded slot ports are rarely used in high-performance loudspeaker enclosures. Moreover, according to conventional wisdom, slot ports having a cross-section exit ratio of greater than 8:1 should be avoided altogether.

Increasing the cross-sectional area of a ducted port can also reduce turbulence and loss, but the length of the ducted port must be increased proportionally to maintain the proper acoustic mass for a given tuning frequency. However, increasing the cross-sectional area can also increase the amount of midrange leakage, and increasing the cross-sectional area also increases the amount of space that the port occupies on a loudspeaker's baffle and within the enclosure. Various formulas are typically used for determining a minimum standard cross section area for a cylindrical ducted port.

In some cases, the entrance and/or exit of a ducted port may be flared in order to reduce turbulent port noise. This approach can reduce port noise to a certain degree, but it also increases the size of the port exit on a speaker baffle. While large port exits are acceptable in some applications, large port exits can be difficult to implement in compact high performance loudspeaker systems, especially those intended for high-performance use in relatively small rooms.

U.S. Pat. No. 7,162,049 to Polk, Jr. discloses various means of controlling turbulence in a duct port by flaring the ends of the duct port. Similarly, U.S. Pat. No. 5,714,721 to Gawronski, et al discloses a port duct with a tapered cross section. However, both of these references require large port exits and may not be suitable for front-loaded use in a compact high-performance loudspeaker system.

Consequently, many loudspeaker designs rear-load the port, placing the port exit on the rear baffle of the loudspeaker enclosure. Rear-loading can decrease the audibility of turbulent port noise and midrange leakage compared to a front-loaded port. However, rear-loading the port also makes the loudspeaker system more sensitive to room placement, and it makes it virtually impossible to mount the loudspeaker system against a rear wall or to flush-mount the loudspeaker within a wall.

SUMMARY

In accordance with various embodiments, some of the problems attendant to front-loaded ports (e.g., midrange leakage, port noise, size, appearance, and the like) may be addressed by utilizing a ducted slot port whose cross-sectional area is relatively small (often smaller than would be called for according to a standard port-diameter determination formula) and whose design minimizes midrange leakage and turbulent port noise. In accordance with various embodiments, a ducted slot port may be designed to incorporate an acoustic low pass filter, such as a bend in the airflow path (to control midrange leakage), and to have a cross-sectional area that varies substantially continuously and symmetrically about a duct-body waist area (to minimize standing waves within the port duct and control turbulent port noise).

DESCRIPTION

Figure 1:
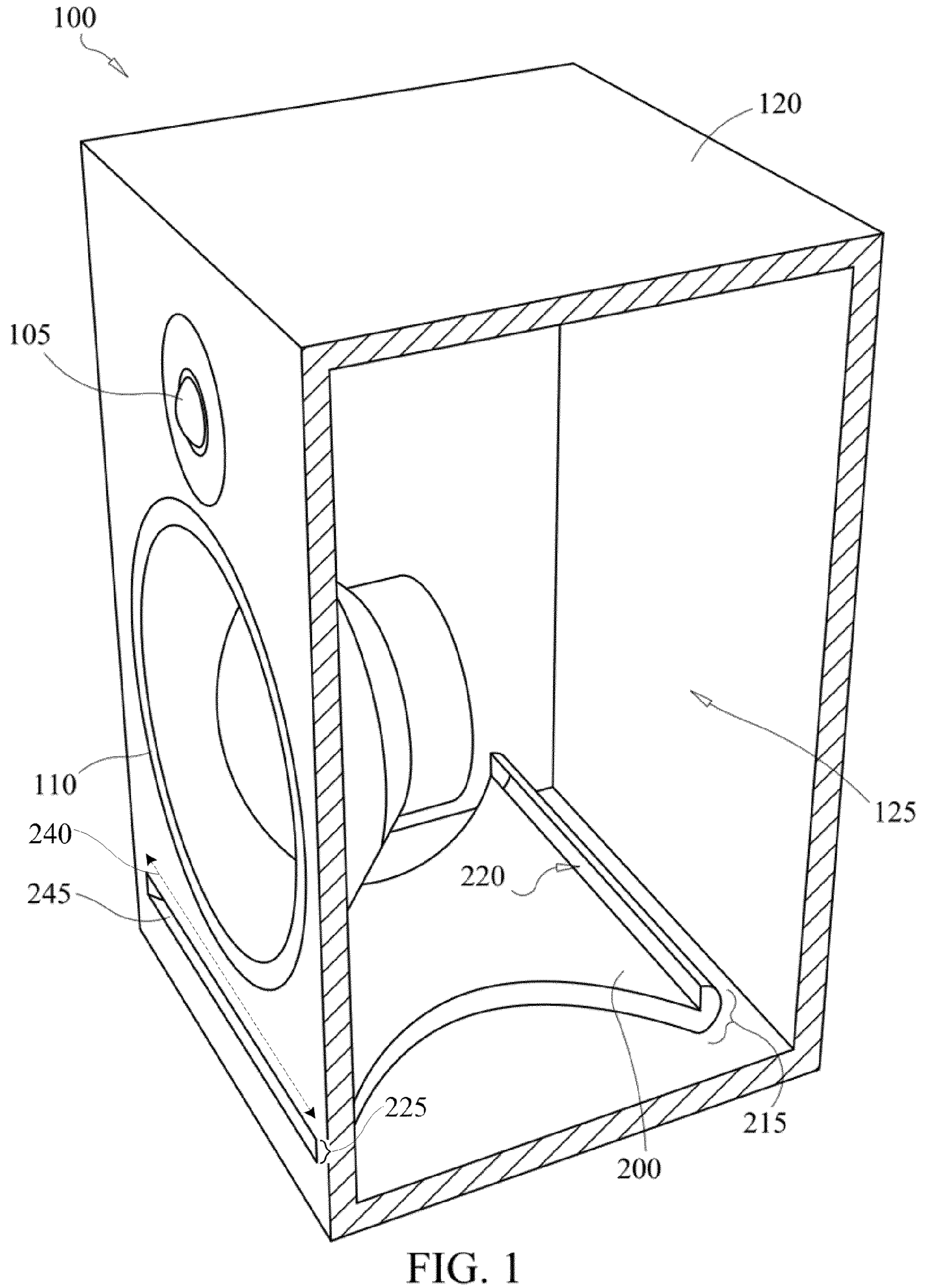
FIG. 1 is a sectional view of a loudspeaker system with a front loaded slot port in accordance with one embodiment.

Reference is now made in detail to the description of various embodiments as illustrated in the drawings. While embodiments are described in connection with the drawings and related descriptions, there is no intent to limit the scope to the embodiments disclosed herein. On the contrary, the intent is to cover all alternatives, modifications and equivalents. In alternate embodiments, additional devices, or combinations of illustrated devices, may be added to, or combined, without limiting the scope to the embodiments disclosed herein.

The phrases "in one embodiment," "in various embodiments," "in some embodiments," and the like are used repeatedly. Such phrases do not necessarily refer to the same embodiment. The terms "comprising," "having," and "including" are synonymous, unless the context dictates otherwise.

FIG. 1 depicts a sectional view of a loudspeaker system 100 in accordance with one embodiment, the system including an enclosure or housing 120 having an interior volume 125, a high frequency transducer 105, a mid-low or low frequency transducer 110, and a duct port assembly 200. Duct port assembly 200 acoustically couples the inside volume 125 of the enclosure 120 with a region exterior to the enclosure 120. Acoustic energy from the interior volume 125 is channeled via duct port assembly 200 and radiated via output slot 245 to the exterior of the enclosure. Output slot 245 has a length 240 and a width 225.

In many embodiments, loudspeaker system 100 may include additional components (not shown), such as one or more active or passive frequency response shaping networks, one or more electrical signal amplifiers, and the like. Moreover, in some embodiments, loudspeaker system 100 may include more or fewer transducers than the two illustrated in FIG. 1. For example, in some embodiments, a loudspeaker system may divide a portion of the audible spectrum among three or more transducers or types of transducers. In other embodiments, a single transducer may be responsible for representing a large portion of the audible spectrum on its own. In some embodiments, a loudspeaker system may be dedicated to reproducing a relatively small portion of the audible spectrum. For example, so-called "subwoofer" loudspeaker systems may have one or more low frequency transducers dedicated to reproducing 1-4 octaves towards the low end of the audible spectrum.

Figure 2:
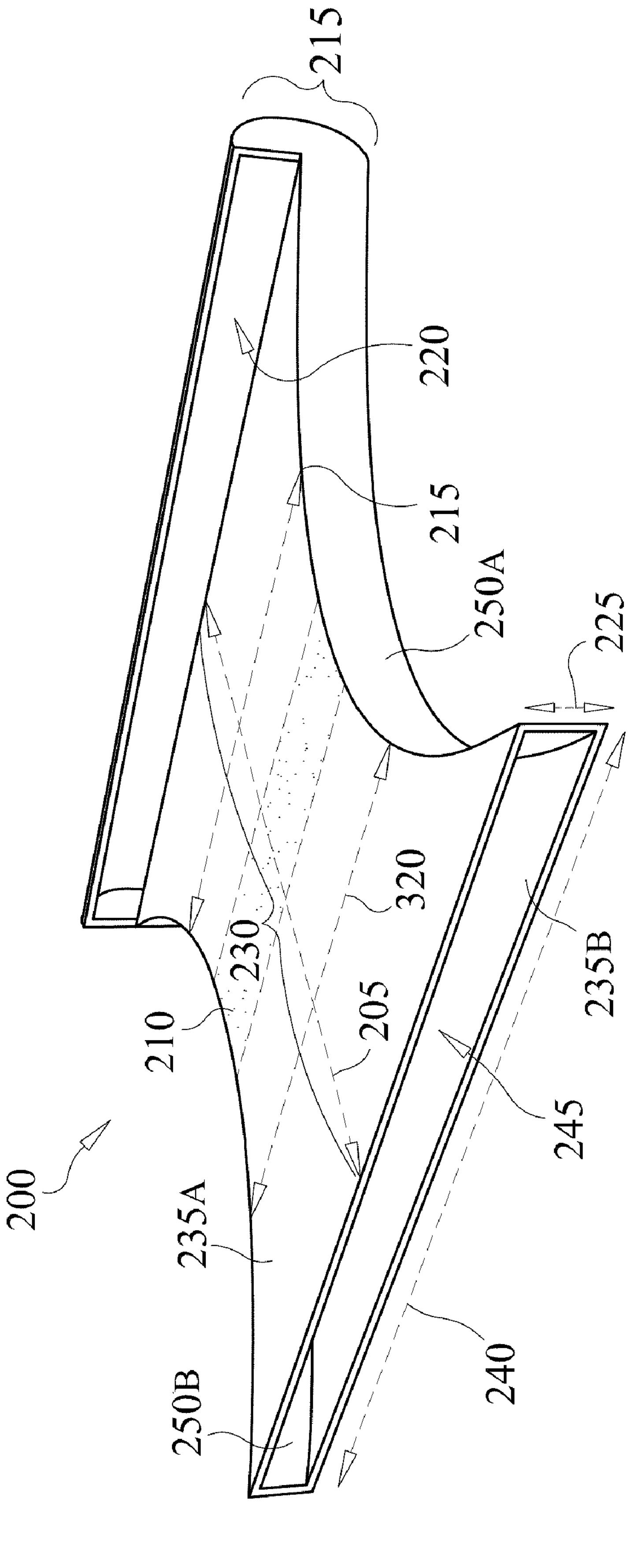
FIG. 2 depicts a ducted port in accordance with one embodiment.

FIG. 2 illustrates several features of an exemplary embodiment of a duct port assembly 200 in accordance with one embodiment. The illustrated duct port assembly 200 includes an input slot 220, a duct bend section 215 (discussed in greater detail below), a duct body section 230, and an output slot 245.

In one embodiment, duct bend section 215 is configured such that acoustic energy within the enclosure's interior volume 125 must negotiate a roughly 160°-180° bend at input slot 220. In one embodiment, duct bend section 215 acts as a low pass acoustic filter to attenuate high- and mid-range frequencies that would otherwise be channeled through the duct port assembly and be radiated through output slot 245. (As used herein, the term "acoustic filter" refers to a port duct assembly that shapes the frequency response of sound waves propagating through air, as opposed to digital or analog shaping networks that filter electrical signals in an electronic circuit.)

Duct body section 230 includes a pair of substantially planar and confronting walls 235A-B. Duct body section 230 also includes a pair of substantially confronting and arcuate (i.e., bow-shaped or curved) side walls 250A-B that converge from either end to a duct-body waist section 210. In the illustrated embodiment, the cross-sectional area of the duct body section 230 varies substantially smoothly, continually, and symmetrically between input slot 220 and output slot 245.

In an exemplary embodiment, duct-body waist section 210 may be located proximate to the midpoint of duct body section 230. In some embodiments, by virtue of arcuate side walls 250A-B, duct body section 230 may have a cross-section area that continually expands from a minimum in duct-body waist section 210 to maxima at input and output slots 220, 245. In an exemplary embodiment, a cross section that varies continually and symmetrically about a central duct-body waist section 230 may minimize standing waves within the duct body section 230 and attenuate noise, turbulence, and/or other distortions commonly introduced by conventional duct ports.

In some embodiments, the cross-section of duct bend section 215 continues to increase smoothly through the bend section 215. However, relatively little performance is lost if the cross section is constant through the duct bend section 215.

Output slot 245 has a shorter dimension (width) 225 and a longer dimension (height) 240. Input slot 220 also has a shorter (width) and a longer (height) dimension (not labeled). In one embodiment, a ratio of the length 240 to the width 225 may be approximately 16:1 (a greater ratio than would be usable according to conventional port designs). In many embodiments, input slot 220 and output slot 245 may have substantially similar dimensions.

Figure 13:
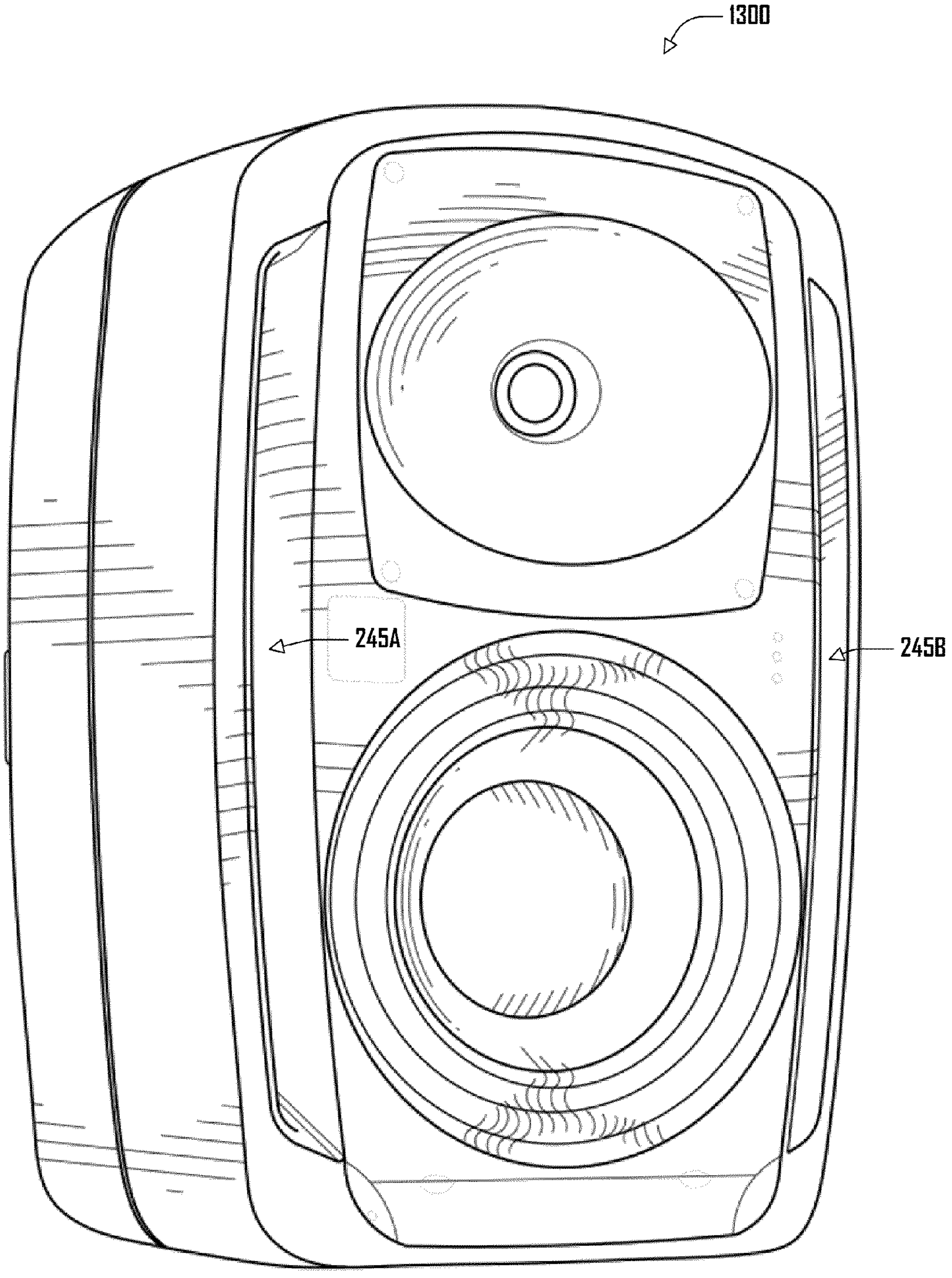
FIG. 13 depicts a loudspeaker system including a pair of front loaded slot ports in accordance with one embodiment.

In many embodiments, output slot 245 may be chamfered or rounded-over (not shown) as it passes through an exterior wall of enclosure 120 (see FIG. 13). In some embodiments, input slot 220 may also be chamfered or rounded-over.

Figure 3:
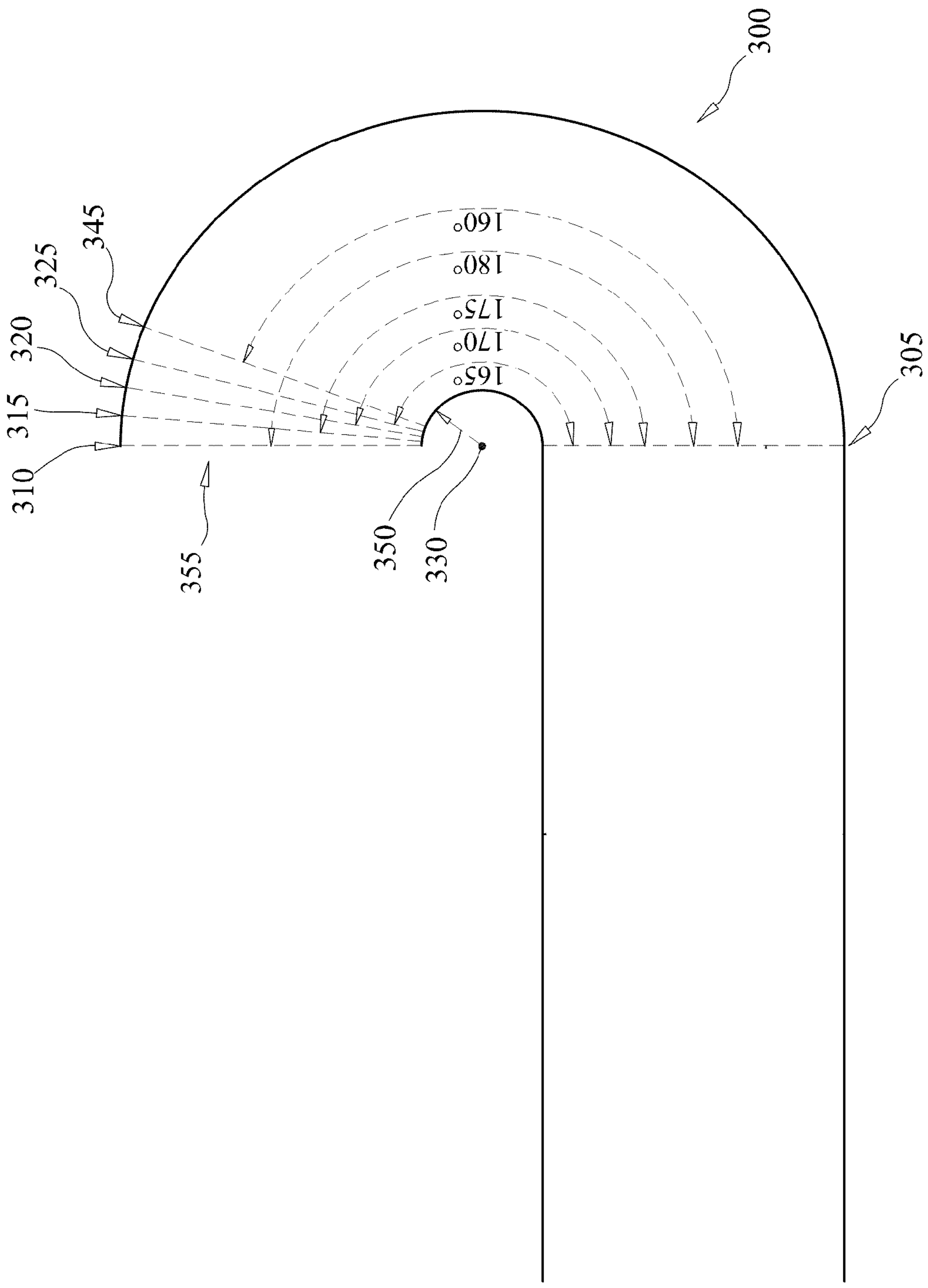
FIG. 3 is a diagram illustrating various low-pass bend geometries in accordance with one embodiment.

FIG. 3 illustrates a cross section of a duct bend section in accordance with one embodiment. The illustrated duct bend section 300 defines an inner curve having a radius 350 and a center point 330. The degree of curvature, or angle, exhibited by the low pass bend 215 may be conveniently measured in reference to input slot 355, which marks the outer bound of duct bend section, and imaginary line 305. In various embodiments, input slot 355 (marking the outer bound of duct bend section 300) may be positioned at various points, e.g., along the curve swept by inner radius 450. Imaginary line 305, which is perpendicular to the long axis 305 of the duct body section, represents the inner bound of the duct bend section 300. In many embodiments, duct bend section 300 subtends at an angle in a range from 160° 445 to 180° 410 to the center point 430. In exemplary embodiments duct bend section 300 subtends at an angle in a range from 170° 420 to 180° 415 to the center point 430.

In other embodiments, duct bend section 300 may subtend at a greater or smaller angle. However, the degree of curvature may affect the amount of attenuation provided in the high- and mid-range. In some embodiments, bend curvatures below 165° may exhibit decreasing attenuation in the desired range, allowing midrange frequencies to pass increasingly freely as the bend curvature decreases. In some embodiments, bend curvatures above 180° may inhibit the flow of air back and forth within the port duct, reducing its ability to reinforce the low frequency output of an active driver. In some embodiments, these characteristics may be acceptable or even beneficial. Thus, bend curvatures of more than 180° or less than 160° could be used in some embodiments.

Figure 4:
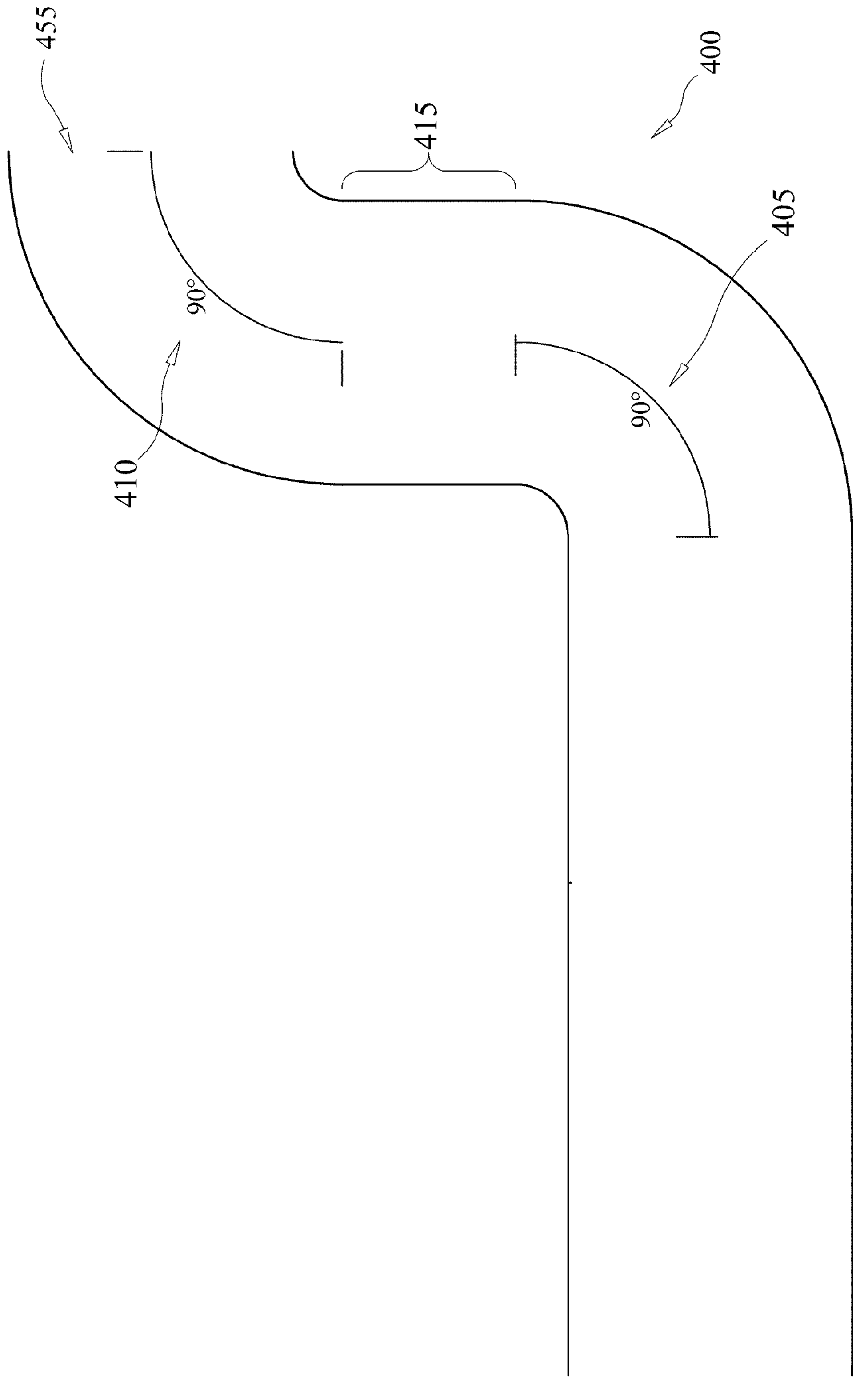
FIG. 4 is a diagram illustrating a compound low pass bend in accordance with one embodiment.

In contrast to the degree of curvature (which may affect high- and mid-range attenuation), the radius 350 of the bend has only a relatively minor effect on the performance of a duct bend section. In an exemplary embodiment (see, e.g., FIGS. 2 and 11-12), the radius 330 of a duct bend section may be less than the width of input slot 355 (and/or output slot, not shown in FIG. 3). Relatively short radii 350 may be desirable in certain embodiments because they make the ducted port assembly smaller and easier to fit into a compact enclosure. However, in embodiments in which the enclosure design allows or mandates a larger radius 330, the duct bend section may still be effective as a low-pass filter. Moreover, as illustrated in FIG. 4, a duct bend section 400 may be constructed of two or more sections of partial curvature, wherein two 90° bends 405, 410 combine to 180° and act as a low pass filter even though they are separated by a section 415 of straight duct.

Figure 5:
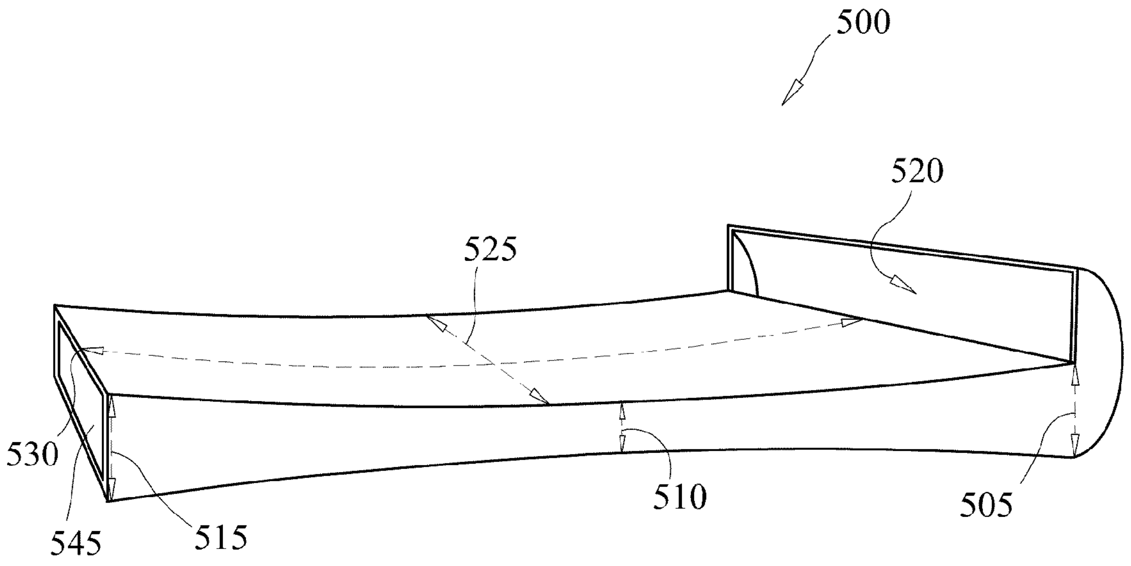
FIG. 5 depicts a vertically varying cross section ducted port with a low-pass bend in accordance with one embodiment.

FIG. 5 illustrates an alternate design of a low-distortion ducted port 500 with a symmetrically varying cross-sectional area. Ducted port 500 has an input slot 520 and an output slot 545. Whereas the ducted port illustrated in FIG. 2 varied its width to vary its cross section, ducted port 500 varies its cross-sectional area by varying its height according to principles discussed above in reference to FIG. 2. In the embodiment illustrated in FIG. 5, the width 525 of the ducted port 500 remains constant, but the height varies roughly symmetrically from its maxima at 505 and 525 down to its minimum proximate to the midline 510.

Figure 6:
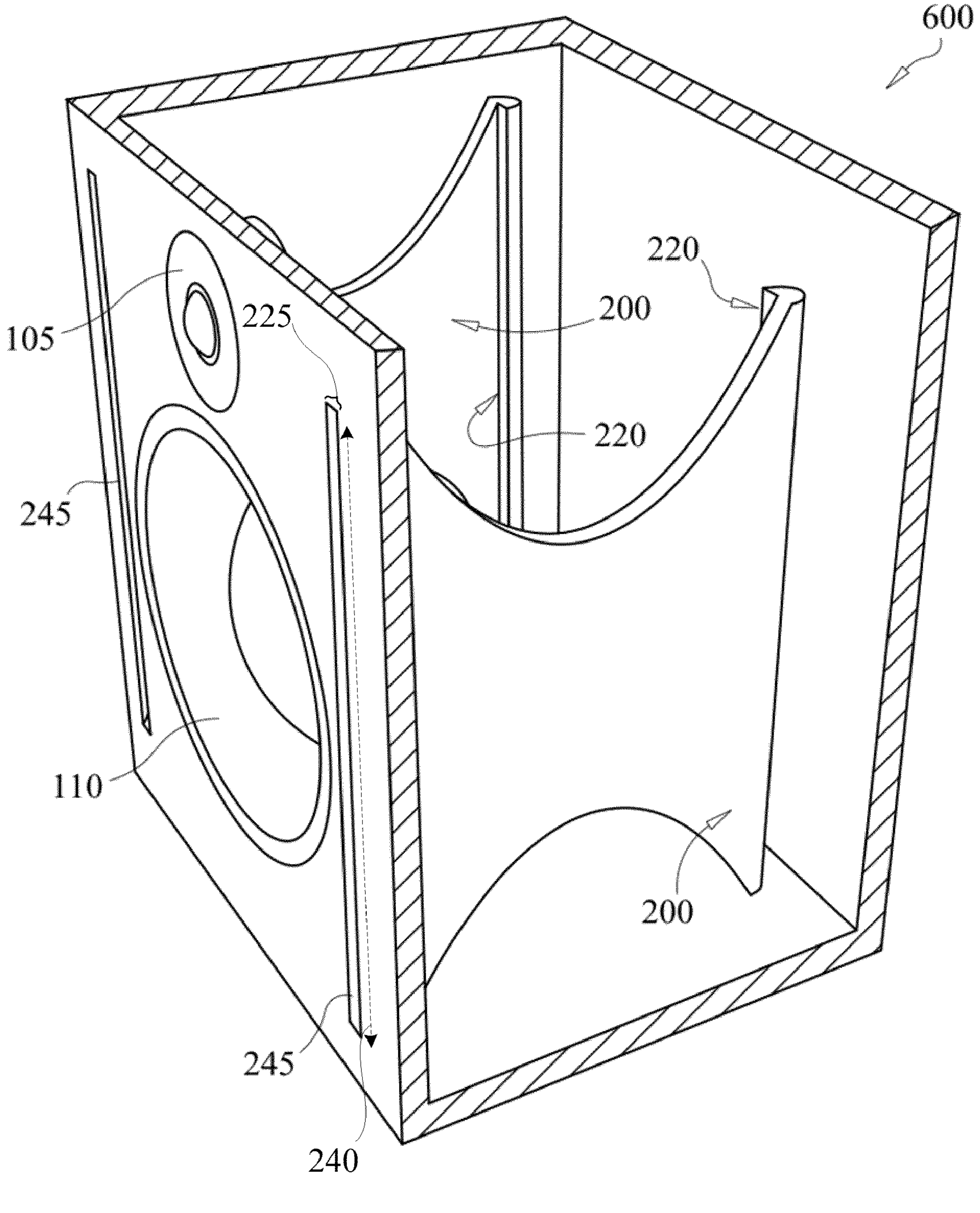
FIG. 6 is a sectional view of a loudspeaker system with front loaded horizontally varying slot ports in accordance with one embodiment.

FIG. 6 illustrates a sectional view of a loudspeaker system incorporating a pair of ducted ports 200 such as those illustrated in FIG. 2.

Figure 7:
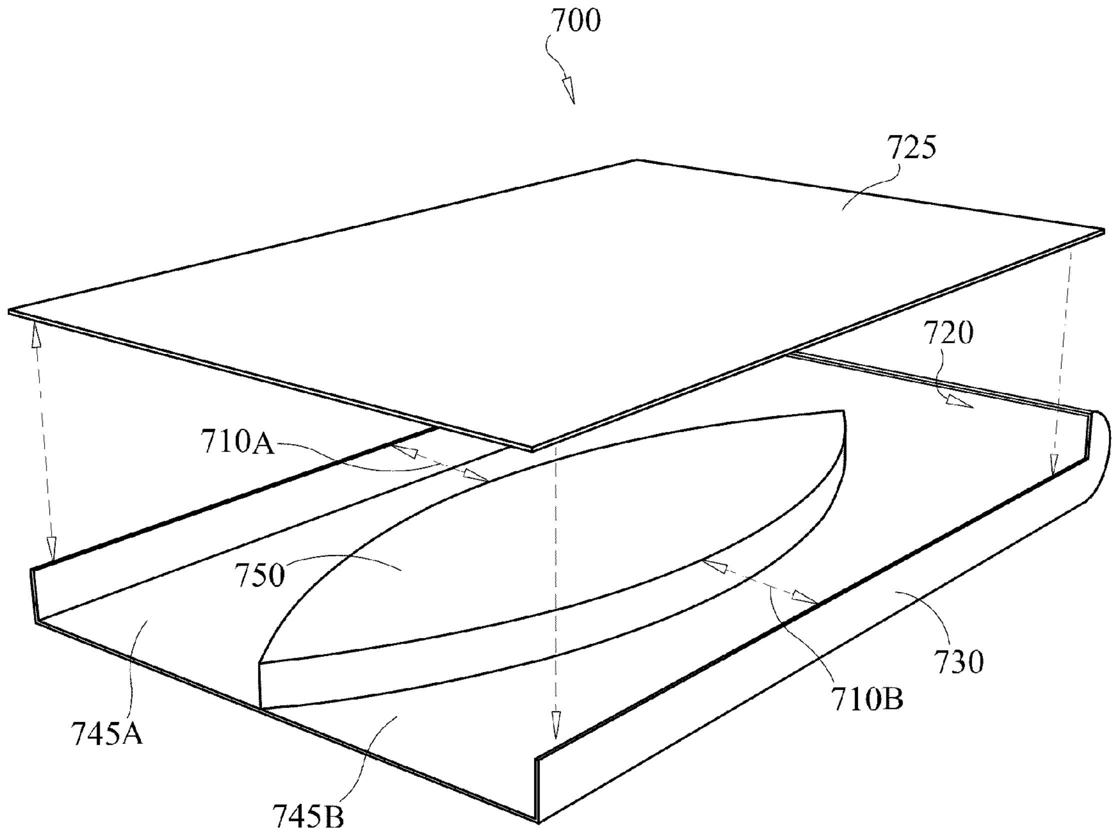
FIG. 7 is an exploded view of a slot port with an internally varying cross section and a low pass bend in accordance with one embodiment.

FIG. 7 illustrates yet another embodiment of an impedance-varying ducted port with a duct bend section. In the illustration, the top 725 of the ducted port 700 has been removed from the bottom 730 section to better illustrate its internal structure. In this embodiment, the ducted port is bisected by a roughly symmetrically curved obstruction 750 that alters the cross-sectional area. The combined cross-sectional areas of the two port channels thus formed vary according to the principles discussed above in reference to FIG. 2. For example, the cross-sectional area of the combined port channels is at its maximum near the input slot 720 and output slots 745A-B. From its maxima, the cross sectional area of the port decreases, substantially smoothly, symmetrically, and continuously, towards a duct-body waist section proximate to the midline 710A-B.

Figure 8:
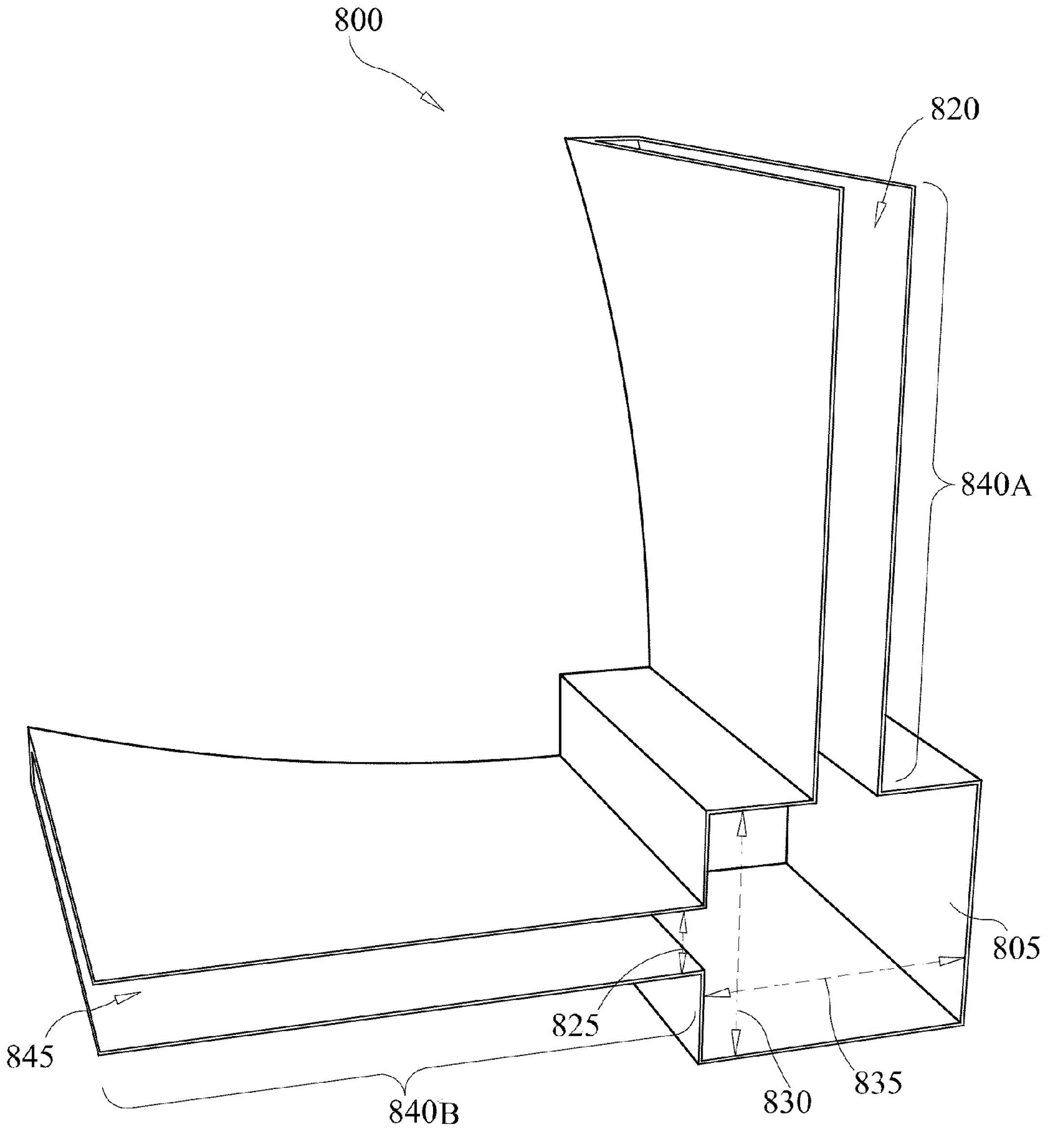
FIG. 8 is a sectional view of a ducted port having a low pass expansion chamber in accordance with one embodiment.

FIG. 8 illustrates a sectional view of alternate embodiment of a ducted port assembly 800. This embodiment utilizes an expansion chamber 805 as an acoustic low pass filter, rather than a low pass bend. Outside the expansion chamber, the port duct segments 840A-B vary according to principles discussed above in reference to FIG. 2. In particular, the cross-sectional area of the port duct segments 840A-B is at its maximum near input slot 820 and output slot 845. From its maxima, the cross sectional area of the port decreases, substantially smoothly, symmetrically, and continuously, towards the bounds of the expansion chamber 805. The characteristics of the expansion chamber low pass filter are determined by the area of the duct segment at it enters the expansion chamber (determined by the width and height 825 of the duct), and the length and area of the expansion chamber (determined by the dimensions of the expansion chamber 830, 835).

Figure 9:
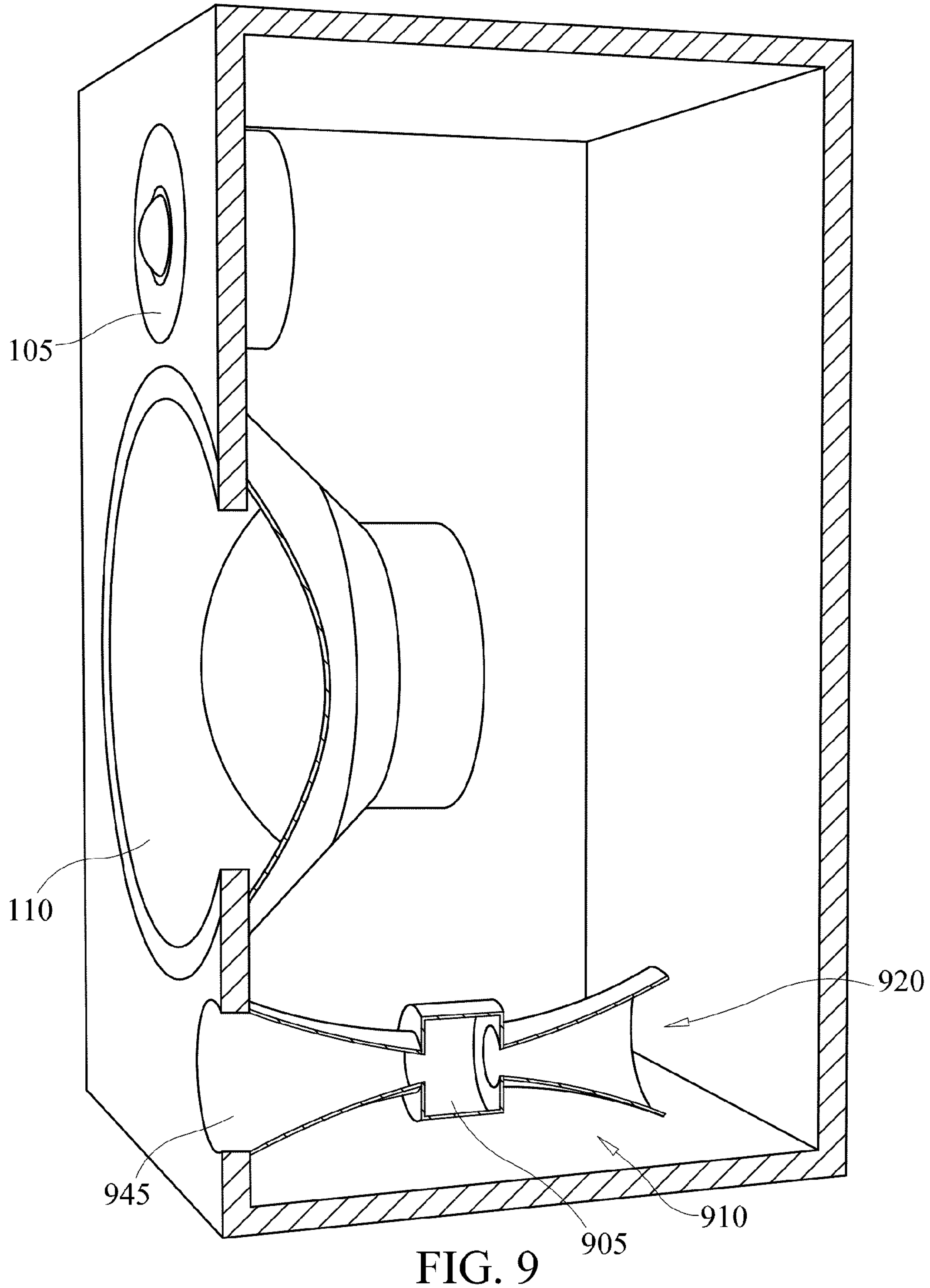
FIG. 9 is a sectional view of a loudspeaker system with a front loaded tubular port having a low pass expansion chamber in accordance with one embodiment.

As illustrated in FIG. 9, the embodiments described herein may also be adapted to tubular ducted ports. FIG. 9 illustrates a sectional view of a loudspeaker system incorporating a tubular embodiment of a low-distortion ducted port 910 with a low pass expansion chamber 905, round input 920 and output 945, and curved tubular duct segments.

Figure 10:
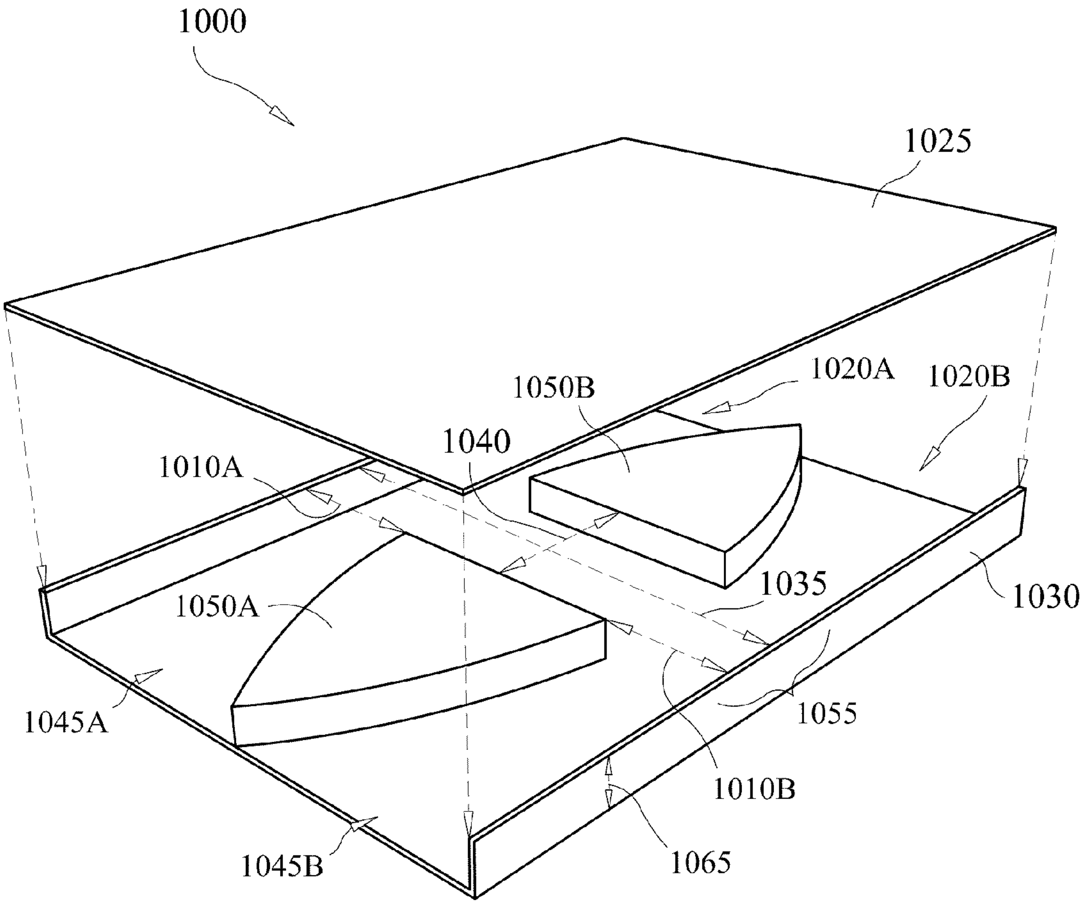
FIG. 10 is an exploded view of a slot port with an internally varying cross section and a low pass expansion chamber in accordance with one embodiment.

FIG. 10 illustrates an alternate embodiment of a low distortion ducted port with a low pass expansion chamber 1055. In the illustration, the top 1025 of the ducted port 1000 has been removed from the bottom 1030 to better illustrate its internal structure. In this embodiment, the ducted port is bisected by roughly symmetrically curved obstructions 1050A-B that alter the cross-sectional area. The combined cross-sectional areas of the two port channels vary according to the principles discussed above in reference to FIG. 2. For example, the cross-sectional area of the combined port channels is at its maximum near the input slots 1020A-B and output slots 1045A-B. From its maxima, the cross sectional area of the port decreases, substantially smoothly, symmetrically, and continuously, to the borders 1010A-B of the expansion chamber 1055. In the illustrated embodiment, the expansion chamber 1055 is formed by a gap in the curved obstruction 1050A-B. The characteristics of the expansion chamber low pass filter are determined by the area of the duct segment as it enters the expansion chamber 1055 (determined by the width 1010A-B and height 1065 of the duct at that point), and the length 1040 and area of the expansion chamber (determined by the width 1035 and height 1065 of the expansion chamber 1055).

Various embodiments of the ducted ports disclosed herein utilize a cross section that varies substantially symmetrically about a duct-body waist section. In some embodiments, symmetrical variation may be utilized because air moves through the port duct in two directions along the entrance-exit axis. In the illustrated embodiment, relatively large cross-sections at the ends of the port duct reduces the average air velocity at the entrance and exit. In many embodiments, reduced entrance and exit air velocities may correspond with reduced port noise compared to higher entrance and exit air velocities.

Nonetheless, in certain embodiments, a ducted port's cross section may not vary symmetrically about a midline. Such asymmetrically varying ducted port embodiments may obtain at least some of the low-distortion characteristics of a symmetrically varying ducted port. Similarly, in other embodiments, a ducted port's cross section may vary non-continuously and/or non-smoothly. Such non-continuously and/or non-smoothly varying ducted port embodiments may obtain at least some low-distortion characteristics of the illustrated embodiments.

The dimensions of the ducted ports described in FIGS. 1-10 were chosen in order to illustrate the various embodiments. In practice, the dimensions of the ducted ports would be determined according to the desired tuning frequency and other desired performance characteristics of the loudspeaker system. In some embodiments, the minimum cross-sectional area (proximate to the midline of the ducted port) is between 40-85% of the cross-sectional area at the entrance/exit of the port.

Figure 11:
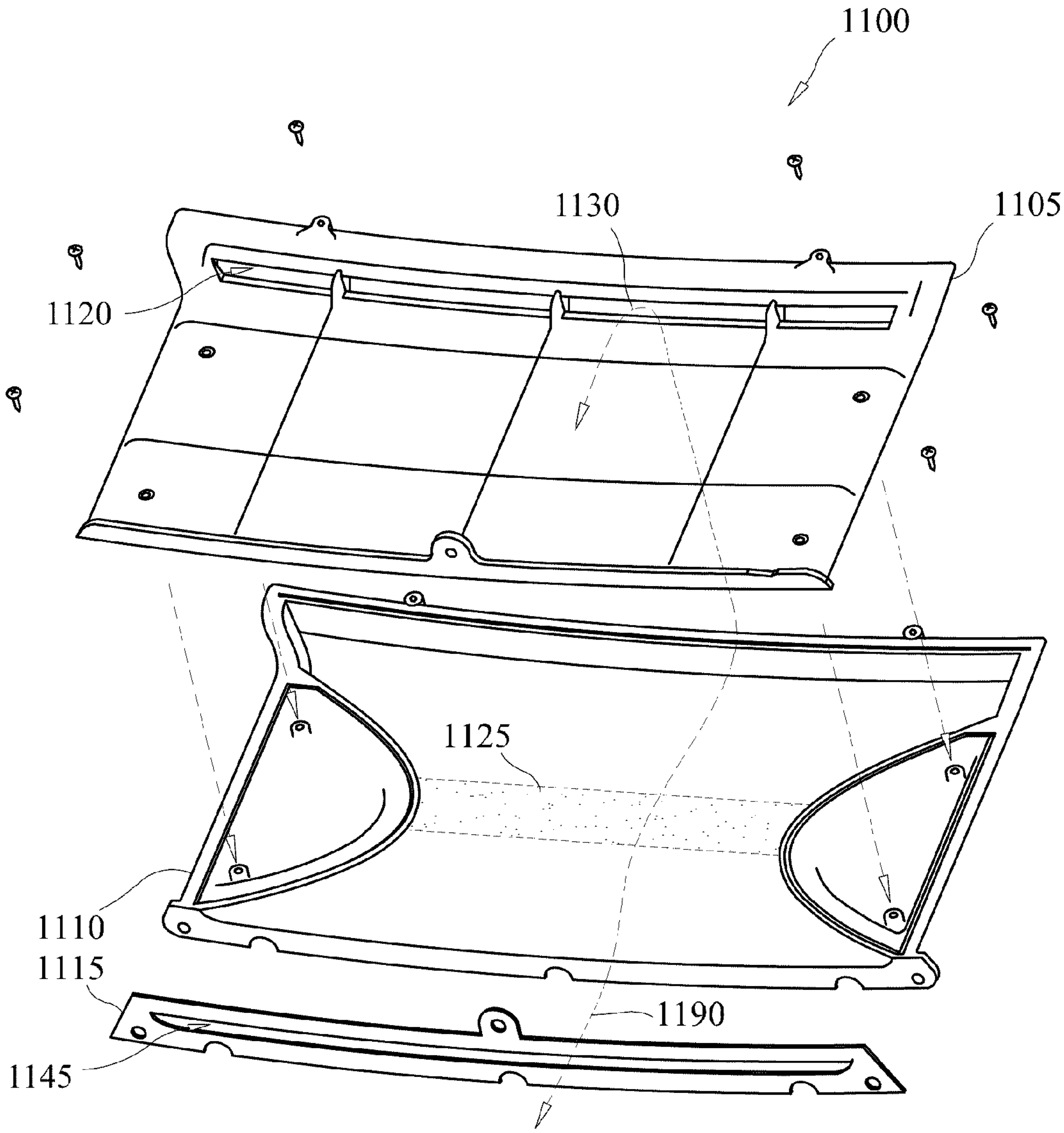
FIG. 11 is an exploded view of a slot port with an internally varying cross section and a low pass bend in accordance with one embodiment.

FIG. 11 depicts an exploded view of one embodiment of a ducted slot port 1100, which is similar to that embodied in the commercially available OPAL™ Active Monitor (see also FIG. 13), manufactured and sold by the assignee of this application.

The illustrated slot port 1100 is formed from a top piece 1105, a bottom piece 1110, and an optional front plate 1115. In some embodiments, the top piece 1105, bottom piece 1110, and/or front plate 1115 may be formed from fiberglass, ABS, plastic, or other suitable material. The commercially available embodiment is injection-molded from ABS. Dashed line 1190 illustrates exemplary airflow through an assembled port duct, the air passing 1130 through the input slot 1120, bending almost 180°, passing through a constricted waist 1125, and passing through the output slot 1145. In the illustrated embodiment, the height of the port exit 1145 is under 1 cm, whereas the port exit is over 30 cm in length. Thus, the illustrated slot port 1100 exhibits a cross-section exit ratio of over 30:1.

Figure 12:
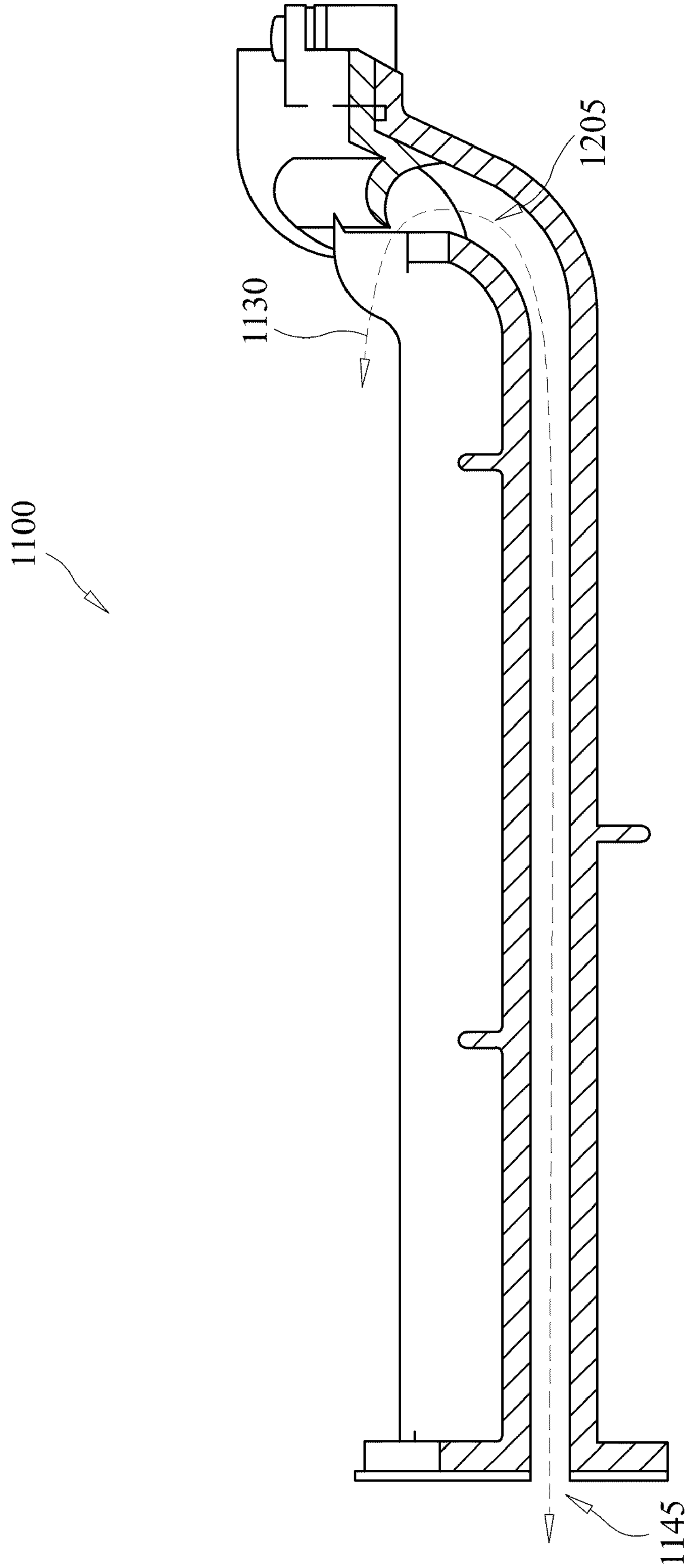
FIG. 12 is a sectional view of the slot port assembly illustrated in FIG. 12 in accordance with one embodiment.

FIG. 12 depicts a cross section of an assembled two-piece slot port 1100, illustrating the bent air passage 1205 formed by the assembly.

FIG. 13 depicts a loudspeaker system 1300 similar to that embodied in the commercially available OPAL™ Active Monitor. Visible on the front baffle of loudspeaker system 1300 are output slots 245A-B, which front-load a pair of ducted slot ports (not shown). In this commercial embodiment, the pair of front-loaded ducted slot ports tune the approximately 24 liter (gross internal volume) enclosure to about 33 Hz. When driven by a suitable low frequency transducer with an appropriate drive signal, anechoic sound pressure levels of up to 100 dB may be obtained with no more than +/−3 dB variance at frequencies down to about 38 Hz. The commercial embodiment is designed to be used for critical listening applications in the near and/or mid field. In various other embodiments, a front-loaded high performance loudspeaker system smaller than about 1 cu. ft. (gross internal volume) incorporating one or more ducted slot ports similar to the illustrated ducted slot ports 1100 may be tuned to tuning frequencies below 40 Hz, with output below 40 Hz usable for critical listening applications at sound pressure levels of up to 100 dB.

Various embodiments described herein have been shown to reduce port noise, midrange leakage, and distortion compared to previously known ducted port designs. The illustrated embodiments may be applied to loudspeaker systems intended to reproduce sound at sound pressure levels around 100 dB and below, such as studio monitors and many high performance home and auto loudspeaker systems. Various embodiments are also applicable to loudspeaker systems designed to reproduce sound at higher sound pressure levels (e.g., up to 130 dB), including in public address and sound reinforcement loudspeaker systems.

In many embodiments, the ducted port may tune the resonant frequency of the enclosure to a frequency below 100 Hz, and the system's "f3" point (the frequency at which the system's response is 3 dB below the system's reference level) may also be below 100 Hz. In an exemplary embodiment, the enclosure may be tuned to between 30-60 Hz, and the system's f3 point may be below 60 Hz. In other embodiments, the enclosure may be tuned up to several octaves higher than 100 Hz.

Although specific embodiments have been illustrated and described herein, it will be appreciated by those of ordinary skill in the art that a whole variety of alternate and/or equivalent implementations may be substituted for the specific embodiments shown and described. This application is intended to cover any adaptations or variations of the embodiments discussed herein. For example, although FIGS. 1, 7, and 10 illustrate embodiments in which ports are front-loaded, in other embodiments, ports may also exit the enclosure somewhere other then the front baffle, including rear-loaded ports, side-loaded ports, top-loaded ports, bottom-loaded ports, and external ports. Similarly, although illustrated embodiments have depicted low pass bends located at the entrance to a ducted port, in various embodiments, a low-pass bend may be located anywhere along the entrance-exit axis.

We claim:

1. A loudspeaker enclosure comprising:

a housing having an inside volume and an exterior region; and a duct port assembly at least partially within the inside volume, the duct port assembly acoustically coupling the inside volume with the exterior region, the duct port assembly including:

an input slot positioned within and configured to receive acoustic energy from the inside volume;

a duct bend section having a first and second end, the input slot being positioned at the first end, the duct bend section being configured to acoustically filter the acoustic energy received from the input slot to yield selectively attenuated acoustic energy, wherein the duct bend section has an inner radius and a center point, and wherein the duct bend section subtends at an angle between about 160°-180° to the center point;

a duct body section connected at the second end of the duct bend section, the duct body section being configured to channel the selectively attenuated acoustic energy towards the exterior region, the duct body section including a pair of planar, confronting walls connected to a pair of arcuate, confronting sidewalls, which define a duct-body waist section; and an output slot connecting the duct body section to the exterior region, the output slot being configured to radiate the selectively attenuated acoustic energy to the exterior region.

2. The loudspeaker enclosure of claim 1 wherein:

the acoustic energy received by the input slot has a spectral frequency distribution; and wherein the duct bend section is configured to attenuate a plurality of spectral frequency components above at least 80 Hz, yielding a modified spectral frequency distribution.

3. The loudspeaker enclosure of claim 1, wherein the inner radius is no greater than a width of the input slot.

4. The loudspeaker enclosure of claim 1, wherein the pair of arcuate confronting sidewalls curve symmetrically about the duct-body waist section.

5. The loudspeaker enclosure of claim 1, wherein the output slot is substantially parallel to the input slot and a length and width of the output slot are substantially similar to a length and width of the input slot.

6. The loudspeaker enclosure of claim 5, wherein the length of the output slot is at least 16 times greater than the width of the output slot.

7. The loudspeaker enclosure of claim 5, wherein the width of the output slot is no greater than about 1 centimeter.

8. The loudspeaker enclosure of claim 5, wherein a cross section area of the duct-body waist section is between 40%-85% of a cross section area of the output slot.

9. The loudspeaker enclosure of claim 1, wherein the duct port assembly is configured to tune the enclosure to a resonant frequency below 100 Hz.

10. The loudspeaker enclosure of claim 1, further comprising a transducer mounted in an opening in the housing.

11. A loudspeaker system comprising:

a housing having an exterior region and an inside volume of less than about 1 cubic foot;

a transducer mounted in an opening in a front wall of the housing;

a duct port assembly within the inside volume, the duct port assembly acoustically coupling the inside volume with the exterior region, the duct port assembly including:

an input slot positioned within and configured to receive acoustic energy from the inside volume;

a duct bend section having a first and second end, the input slot being positioned at the first end, the duct bend section being configured to acoustically filter the acoustic energy received from the input slot to yield selectively attenuated acoustic energy, wherein the duct bend section has an inner radius and a center point, and wherein the duct bend section subtends at an angle between about 160°-180° to the center point;

a duct body section connected at the second end of the duct bend section, the duct body section being configured to channel the selectively attenuated acoustic energy towards the exterior region, the duct body section including a pair of planar confronting walls connected to a pair of arcuate confronting sidewalls, which define a duct-body waist section; and an output slot connecting the duct body section to the exterior region via an opening in the front wall of the housing, the output slot being configured to radiate the selectively attenuated acoustic energy to the exterior region, the output slot having a width of less than about 1 cm and a length of about 30 cm.

12. A method of acoustically coupling an inside volume of a loudspeaker enclosure to an exterior region via a duct port assembly positioned within the inside volume, the method comprising:

receiving acoustic energy from the inside volume via a duct port input slot;

acoustically filtering the received acoustic energy to yield selectively attenuated acoustic energy via a duct bend section coupled to the duct port input slot, wherein the duct bend section has an inner radius and a center point, and wherein the duct bend section subtends at an angle between about 160°-180° to the center point;

channelling the selectively attenuated acoustic energy towards the exterior region via a duct body section comprising a pair of planar confronting walls connected to a pair of arcuate confronting sidewalls, which define a duct-body waist section;

radiating the selectively attenuated acoustic energy to the exterior region via a duct port output slot.

13. The method of claim 12, wherein acoustically filtering the received acoustic energy comprises attenuating a plurality of acoustic energy spectral frequency components above at least 80 Hz, yielding a modified spectral frequency distribution.

* * * * *